(12) United States Patent
Su et al.

(10) Patent No.: US 7,088,592 B2
(45) Date of Patent: Aug. 8, 2006

(54) ESD PROTECTION STRUCTURE AND DEVICE UTILIZING THE SAME

(75) Inventors: Po-Chang Su, Kaohsiung (TW); Po-Hsun Chen, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 10/921,144

(22) Filed: Aug. 19, 2004

(65) Prior Publication Data

US 2005/0088832 A1 Apr. 28, 2005

(30) Foreign Application Priority Data

Oct. 24, 2003 (TW) .............................. 92129535 A

(51) Int. Cl.
*H05K 9/00* (2006.01)
(52) U.S. Cl. ...................... 361/753; 361/799; 361/752; 174/35 GC
(58) Field of Classification Search ................ 361/753, 361/799, 816, 818, 800, 752, 750, 748, 760, 361/790–795, 775, 777, 779; 174/35 R, 174/35 GC, 50, 52.1, 35 MS
See application file for complete search history.

(56) References Cited

U.S. PATENT DOCUMENTS

| | | | | |
|---|---|---|---|---|
| 3,671,811 A | * | 6/1972 | Ezaki | ........................ 361/806 |
| 4,480,240 A | * | 10/1984 | Gould | ........................ 333/246 |
| 5,502,620 A | * | 3/1996 | Funck et al. | ................. 361/753 |
| 5,521,006 A | * | 5/1996 | Osato | ........................ 428/332 |
| 5,526,235 A | * | 6/1996 | Beason et al. | .............. 361/799 |
| 5,592,391 A | * | 1/1997 | Muyshondt et al. | .......... 716/15 |
| 5,880,937 A | * | 3/1999 | Schadhauser et al. | ....... 361/794 |
| 5,963,219 A | * | 10/1999 | Choi | .......................... 345/501 |
| 5,975,953 A | * | 11/1999 | Peterson | ..................... 439/607 |
| 5,986,892 A | * | 11/1999 | Hargy, III | ................... 361/759 |
| 6,188,017 B1 | * | 2/2001 | August, Jr. | ............ 174/35 GC |
| 6,735,087 B1 | * | 5/2004 | Inoue et al. | ................. 361/736 |
| 6,741,478 B1 | * | 5/2004 | Shimizu et al. | ............. 361/760 |
| 6,771,516 B1 | * | 8/2004 | Leman et al. | ............... 361/825 |
| 6,835,087 B1 | * | 12/2004 | Yamawaki | .................. 439/358 |
| 6,972,967 B1 | * | 12/2005 | Norte et al. | ................. 361/818 |

* cited by examiner

*Primary Examiner*—Randy W. Gibson
*Assistant Examiner*—Dameon E. Levi
(74) *Attorney, Agent, or Firm*—Birch, Stewart, Kolasch and Birch, LLP

(57) ABSTRACT

An electronic device utilizing an electrostatic discharge (ESD) protection structure. The electronic device comprises a housing and a printed circuit board (PCB) with an ESD protection structure disposed thereon. The PCB has at least one metal layer with a ground circuit and a functional circuit. The ground circuit includes at least one device-protecting area near the edge of the PCB and exposed on the surface thereof. The device-protecting area is covered by a thick conductive layer, and electric components are disposed nearby, such that static electricity can be transferred to ground through the ground circuit of the PCB to protect the electronic device from interferences and damages.

5 Claims, 2 Drawing Sheets

ESD PROTECTION STRUCTURE AND DEVICE UTILIZING THE SAME

This Nonprovisional application claims priority under 35 U.S.C. § 119(a) on Patent Application No(s). 092129535 filed in Taiwan, Republic of China on Oct. 24, 2003, the entire contents of which are hereby incorporated by reference.

BACKGROUND OF THE INVENTION

1. Field of the Invention

The present invention relates to an electrostatic discharge (ESD) protection structure, and in particular to an electronic device or a printed circuit board with a simplified ESD protection structure.

2. Description of the Related Art

As technology improves, electronic components become more and more complicated reducing the tolerance for electromagnetic interference (EMI) and electrostatic discharge (ESD). It is therefore conventional electronic devices require additional ESD protection circuits to protect important chips or other electronic components therein.

In most electronic devices, operating controls connect to specific pins of a chip to enable specific functions, such as controls for a CD drive or function keys of a mobile phone. Gaps between controls and the housing of the device, considerable electrostatic charges carried by users, which can enter circuits through air or direct contract, interfering with or damaging electronic components therein.

FIG. 1 shows a conventional ESD circuit of an electronic device. In FIG. 1, a control 10 is connected to a specific pin of a chip through a conventional ESD protection circuit 20. The ESD protection circuit 20 comprises a resistor 26, two Zener diodes 22a, 22b and two capacitors 24a, 24b. The positive pole of Zener diode 22a and the negative pole of Zener diode 22b are connected to the resistor 26. The Zener diodes 22a, 22b are individually connected to ground with the capacitors 24a, 24b connected in series to filter out high frequency noise. Electrostatic charges can be transferred to ground through the Zener diode 22b when the control 10 receives sufficient positive electrostatic charge, or through the Zener diode 22a when the control 10 receives negative electrostatic charge. Thus, the output voltage $V_o$ of the ESD protection circuit 20 in unaffected by electrostatic charge, and electronic components are protected from EMI or ESD.

The conventional ESD protection circuit requires two Zener diodes, two larger capacitors and a distinct resistor. When an electronic device has a plurality of separately disposed controls, however, multiple ESD protection circuits are required to provide sufficient protection, thus increasing the cost of the device.

SUMMARY OF THE INVENTION

Accordingly, an object of the invention is to provide a simple ESD protection structure for a PCB, providing requisite ESD protection without the need for conventional ESD protection circuit, whereby the fabricating cost are reduced.

To achieve the object of the present invention, the present invention provides a printed circuit board with an ESD protection structure. The printed circuit board has at least one metal layer comprising a functional circuit and a ground circuit. The ground circuit comprising a device-protecting area near the edge of the PCB and exposed on the surface thereof. An electronic component is disposed on the PCB near the device-protecting area and electrically connected to the functional circuit. A conductive layer of a predetermined thickness is disposed on the metal layer within the device-protecting area, such that static electricity can be transferred to ground through the ground circuit of the PCB to protect the electronic device from interferences.

In a preferred embodiment, the device-protecting area is parallel to the edge of the PCB. The conductive layer is a solder layer formed by surface-printing to transfer electrostatic charges passing thereby to the ground circuit. The predetermined thickness of the conductive layer is between 50 µm and 1 mm.

The present invention also provides an electronic device utilizing an ESD protection structure. The electronic device includes a housing and the PCB disclosed. The housing comprising a hole or a slit. An electronic component, such as a button, is disposed near or protruding from the hole, such that the static electricity is transferred to ground through the conductive layer and the ground circuit of the PCB to protect the electronic device.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and accompanying drawings, which are given by way of illustration only, and thus are not limitative of the present invention, and wherein.

DETAILED DESCRIPTION OF THE INVENTION

In order to distinguish the differences between the ESD protection structure of the present invention and a conventional ESD protection circuit, the electronic device disclosed in this embodiment is, without intending to limit the disclose thereto, a CD drive.

Figure 1:
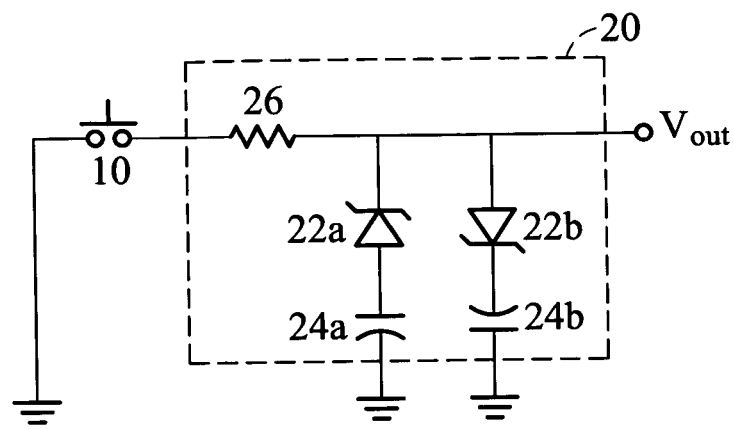
FIG. 1 is a circuit diagram of a conventional ESD circuit.
Figure 2:
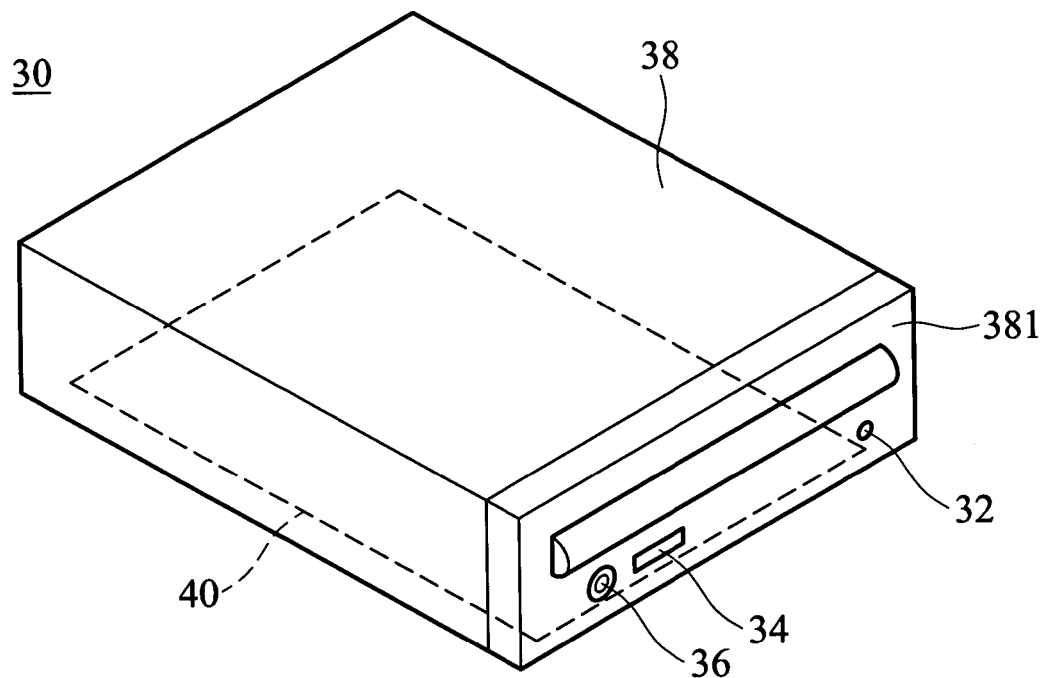
FIG. 2 is a perspective view of a CD drive utilizing the ESD protection structure of the invention.

FIG. 2 shows a CD drive 30 with the ESD protection structure of the invention. In FIG. 2, the CD drive comprises a housing 38, PCB 40 and faceplate 381. The PCB 40 is disposed on the bottom surface of the housing 38. An eject control 32, volume control 34 and audio output connection 36 are disposed on the faceplate 381 and electrically connected to the PCB 40.

Figure 3A:
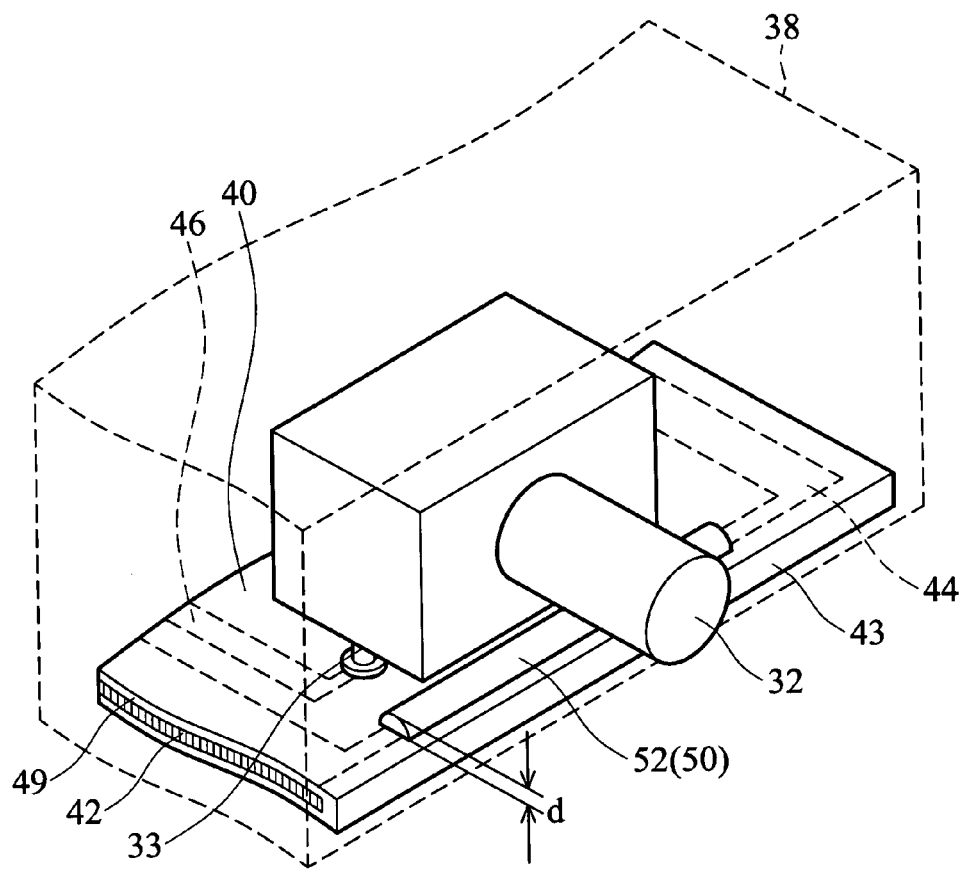
FIG. 3A is a schematic view of a PCB disposed in the CD drive of FIG. 2 with the housing thereof shown by a dashed line.
Figure 3B:
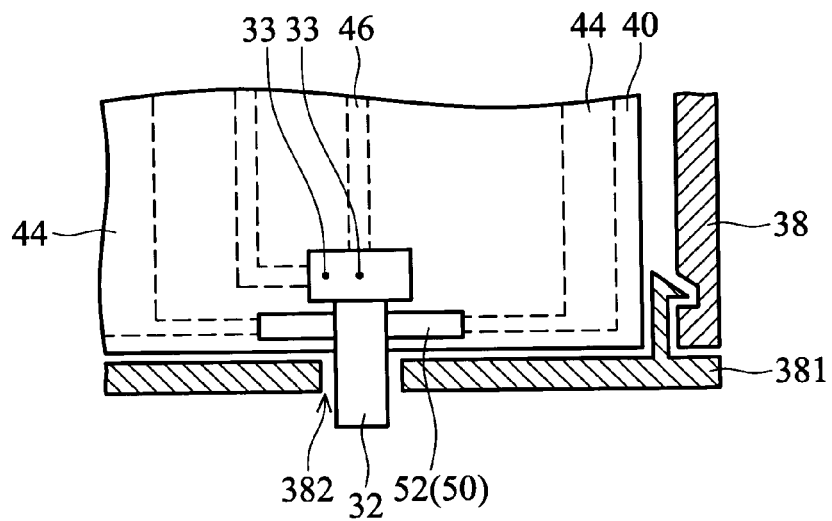
FIG. 3B is a top view of FIG. 3A.

FIG. 3A is an enlarged schematic view of the CD drive near the eject control in FIG. 2. For clarity, the housing 38 of the CD drive is shown by a dashed line. FIG. 3B is a top view of FIG. 3A. The eject control 32 is connected to the PCB 40 near the front edge 43 and the faceplate 381 through two pins 33. Because the eject control 32 protrudes from the faceplate 381, the interval between the pins 33 of the eject control 32 and the front edge 43 of the PCB 40 is small.

In FIGS. 3A and 3B, the PCB 40 with an ESD protection structure of the invention has at least one metal layer 42 with a ground circuit 44 and a functional circuit 46. The functional circuit 46 is the main circuit on the PCB 40, connecting chips (not shown), the eject control 32, volume control 34, audio output connection 36 or other electronic components. The ground circuit 44 is arranged on the PCB 40 of the area without the functional circuit 46, transferring electrostatic charges to ground and protecting the electronic components in the CD drive 20.

In FIG. 3A, the ground circuit 44 passes through the area between the pins 33 and the front edge 43 of the PCB 40, forming an elongated device-protecting area 50 parallel to the front edge 43 of the PCB 40. The eject control 32 is disposed in the device-protecting area 50, protruding out from the faceplate 381. The metal layer 42 in the device-protecting area 50 is not covered by the insulation layer 49 of the PCB 40, but exposed, forming a ground electrode. A conductive layer 52 of a predetermined thickness (d) is formed on the metal layer 42 within the device-protecting area 50. Because the interval between the pins 33 of the control 32 and the front edge 43 of the PCB 40 is small, the conductive layer 52 of the invention is thick enough to enlarge contact surface with air and the cross section thereof. When the eject control 32 is used, electrostatic discharge may occur, whereby considerable electrostatic charges may enter the circuit of the PCB 40 through the gap 382 or the pins 33 of the eject control 32. At this point, electrostatic charges can be quickly transferred to a ground terminal of the CD drive 30 to protect the functional circuit 46 and other electronic components of the PCB 40.

Preferably, the conductive layer 52 within the device-protecting area 50 is a solder layer formed by surface printing or coating. The preferred thickness (d) of the solder layer is between 50 µm and 1 mm, sufficient to direct electrostatic charges entering circuits on the PCB 40 through the front edge 43 to ground through the ground circuit 44.

Accordingly, the ESD protection structure of the invention has an exposed ground electrode and a thick solder layer arranged around electronic components. The ESD protection structure transfers outside electrostatic charges to the ground terminal of an electronic device, improving ESD protection of the electronic device without the need for a conventional ESD protection circuit. Thus, fabrication costs are reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a housing having an insulating portion with a gap;
   a printed circuit board disposed in the housing;
   a ground circuit arranged on the printed circuit board; and
   a ground electrode arranged on the printed circuit board near the gap and connecting the ground circuits,
   wherein a length of the ground electrode equals, or is greater than a length of the gap.

2. An electronic device, comprising:
   a housing having a faceplate;
   a printed circuit board disposed in the housing and having an upper surface, a front edge and a ground circuit, wherein the ground circuit is formed on the upper surface; and
   an electronic component disposed on the faceplate and having a pin electrically connected to the printed circuit board, wherein the ground circuit passes through the area between the pin and the front edge of the printed circuit board.

3. The electronic device as claimed in claim 2, wherein the front edge is adjacent to the faceplate.

4. The electronic device as claimed in claim 2, wherein the electronic component is a control.

5. The electronic device as claimed in claim 2, wherein the ground circuit is electrically connected to the housing.

* * * * *